(12) United States Patent
Kang et al.

(10) Patent No.: US 11,871,604 B2
(45) Date of Patent: Jan. 9, 2024

(54) COVER WINDOW, METHOD OF MANUFACTURING THE SAME, AND DISPLAY DEVICE HAVING THE SAME

(71) Applicant: Samsung Display Co., Ltd., Yongin-Si (KR)

(72) Inventors: Byunghoon Kang, Hwaseong-si (KR); Seungho Kim, Asan-si (KR); Gyuin Shim, Yongin-si (KR); Seung Kim, Seongnam-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 86 days.

(21) Appl. No.: 17/223,358

(22) Filed: Apr. 6, 2021

(65) Prior Publication Data
US 2022/0022334 A1 Jan. 20, 2022

(30) Foreign Application Priority Data

Jul. 16, 2020 (KR) .................. 10-2020-0088049

(51) Int. Cl.
*C03C 17/32* (2006.01)
*B32B 7/12* (2006.01)
(Continued)

(52) U.S. Cl.
CPC ............ *H10K 50/844* (2023.02); *B32B 7/12* (2013.01); *B32B 17/06* (2013.01); *C03C 17/324* (2013.01); *C03C 17/328* (2013.01); *H05K 5/0017* (2013.01); *B32B 2255/26* (2013.01); *B32B 2255/28* (2013.01); *B32B 2307/51* (2013.01);
(Continued)

(58) Field of Classification Search
CPC ............ H01L 51/5253; H01L 51/0097; H01L 2251/5338; B32B 7/12; B32B 17/06; B32B 2255/26; B32B 2255/28; B32B 2307/51; B32B 2457/20; C03C 17/324; C03C 17/328
See application file for complete search history.

(56) References Cited

U.S. PATENT DOCUMENTS 10,101,772 B2  10/2018 Aurongzeb et al.
10,299,390 B2 *  5/2019 Ki .......................... G06F 1/1637
(Continued)

FOREIGN PATENT DOCUMENTS

KR         101355211 B1    1/2014
KR       1020160095708 A   8/2016
(Continued)

OTHER PUBLICATIONS

Park et al. (KR 10-2019-0075715 A); Jul. 1, 2019 (EPO machine translation to English). (Year: 2019).*

*Primary Examiner* — David Sample
*Assistant Examiner* — Donald M Flores, Jr.
(74) *Attorney, Agent, or Firm* — CANTOR COLBURN LLP

(57) ABSTRACT

A cover window includes a base layer including a bending portion bent about a bending axis extending in one direction, a first flat portion, and a second flat portion spaced apart from the first flat portion with the bending portion interposed therebetween in a direction crossing the one direction and facing each other and a first coating portion disposed on the bending portion and having a first modulus less than a modulus of the base layer.

17 Claims, 15 Drawing Sheets

(51) Int. Cl.
   *B32B 17/06*     (2006.01)
   *H01L 51/52*     (2006.01)
   *H05K 5/03*      (2006.01)
   *H05K 5/00*      (2006.01)
   *H10K 50/844*    (2023.01)
   *H10K 77/10*     (2023.01)
   *H10K 102/00*    (2023.01)

(52) U.S. Cl.
   CPC ......... *B32B 2457/20* (2013.01); *H10K 77/111* (2023.02); *H10K 2102/311* (2023.02)

(56)      References Cited

U.S. PATENT DOCUMENTS

| | | |
|---|---|---|
| 2015/0037554 A1* | 2/2015 | Gao .................. C03C 17/225 |
| | | 428/217 |
| 2016/0223722 A1 | 8/2016 | Ahn |
| 2018/0132371 A1* | 5/2018 | Yeum .................. B32B 17/00 |
| 2019/0213925 A1 | 7/2019 | Ha et al. |

FOREIGN PATENT DOCUMENTS

| | | | | |
|---|---|---|---|---|
| KR | 101699305 B1 | 1/2017 | | |
| KR | 1020170080446 A | 7/2017 | | |
| KR | 2019075715 A * | 7/2019 | ....... | G02F 1/133308 |
| KR | 1020190075715 A | 7/2019 | | |
| KR | 1020190084185 A | 7/2019 | | |
| KR | 1020200024810 A | 3/2020 | | |
| WO | WO-2018057774 A1 * | 3/2018 | ............. | B32B 17/06 |

\* cited by examiner

COVER WINDOW, METHOD OF MANUFACTURING THE SAME, AND DISPLAY DEVICE HAVING THE SAME

This application claims priority to Korean Patent Application No. 10-2020-0088049, filed on Jul. 16, 2020, and all the benefits accruing therefrom under 35 U.S.C. § 119, the content of which in its entirety is herein incorporated by reference.

BACKGROUND

1. Field

The disclosure relates to a cover window, a method of manufacturing the cover window, and a display device including the cover window. More particularly, the disclosure relates to a cover window with improved strength, a method of manufacturing the cover window, and a display device having the cover window.

2. Description of the Related Art

Various display devices, which are widely applied to a multimedia device, such as a television set, a mobile phone, a tablet computer, a game unit, etc., are being developed. In recent years, display devices provided with a curved surface, such as a curved display device, a bendable display device, or a rollable display device, are being developed in addition to a flat display device.

SUMMARY

In a display device provided with a curved surface, a bending area included in the display device is more vulnerable to external impacts than a flat area. Accordingly, improvement of strength of the display device, especially, strength of the bending area, is desired.

The disclosure provides a cover window having improved strength.

The disclosure provides a method of manufacturing the cover window.

The disclosure provides a display device including the cover window.

An embodiment of the invention provides a cover window including a base layer including a bending portion bent about a bending axis extending in one direction, a first flat portion, and a second flat portion spaced apart from the first flat portion with the bending portion interposed therebetween in a direction crossing the one direction and facing each other, and a first coating portion disposed on the bending portion and having a first modulus less than a modulus of the base layer.

In an embodiment, a thickness of a center portion of the first coating portion, which overlaps the bending axis, may be greater than a thickness of opposing end portions of the first coating portion, which are opposite to each other.

In an embodiment, a thickness of the first coating portion may be equal to or greater than about 50 micrometers (μm) and equal to or less than about 150 μm.

In an embodiment, the first coating portion may include at least one selected from polypropylene, polyethylene, and polyethylene terephthalate.

In an embodiment, the first coating portion may be in contact with the bending portion.

In an embodiment, the cover window may further include a second coating portion disposed on the first flat portion and the second flat portion, where the second coating portion may have a second modulus is equal to or greater than the first modulus and less than the modulus of the base layer.

In an embodiment, the second coating portion may be disposed under the first coating portion and covers an entire surface of the base layer.

In an embodiment, the cover window may further include a third coating portion disposed between the first coating portion and the second coating portion to cover the second coating portion. In such an embodiment, the third coating portion may have a modulus equal to the first modulus, and the second modulus may be greater than the first modulus.

In an embodiment, the second coating portion may include a first sub-coating portion disposed on the first flat portion and a second sub-coating portion disposed on the second flat portion, and the first sub-coating portion and the second sub-coating portion may be spaced apart from each other with the first coating portion interposed therebetween.

In an embodiment, the first coating portion may have a thickness equal to a thickness of the second coating portion.

In an embodiment, a thickness of the first coating portion may be greater than a thickness of the second coating portion.

In an embodiment, the base layer may include a glass material.

In an embodiment, the base layer may have a thickness equal to or greater than about 0.1 millimeter (mm) and equal to or less than about 1.0 mm.

An embodiment of the invention provides a display device including a display panel including a bending area bent about a bending axis extending in one direction, a first flat area, and a second flat area spaced apart from the first flat area with the bending area interposed therebetween in a direction crossing the one direction and facing each other, a cover window disposed on the display panel, and an adhesive layer disposed between the display panel and the cover window. In such an embodiment, the cover window includes a base layer including a first flat portion corresponding to the first flat area, a bending portion corresponding to the bending area, and a second flat portion corresponding to the second flat area and a first coating portion disposed on the bending portion and having a first modulus less than a modulus of the base layer.

In an embodiment, the first coating portion may have a thickness equal to or greater than about 50 μm and equal to or less than about 150 μm.

In an embodiment, a thickness of a center portion of the first coating portion, which overlaps the bending axis, may be greater than a thickness of opposing end portions of the first coating portion, which are opposite to each other.

In an embodiment, the display device may further include a second coating portion having a second modulus and disposed on the first flat portion and the second flat portion, where the second coating portion may have a second modulus equal to or greater than the first modulus and less than the modulus of the base layer.

An embodiment of the invention provides a method of manufacturing a cover window. In such an embodiment, the manufacturing method of the cover window includes inserting a base layer into a supporter, where the base layer includes a bending portion bent about a bending axis extending in one direction, a first flat portion, and a second flat portion spaced apart from the first flat portion with the bending portion interposed therebetween in a direction crossing the one direction and facing each other, and the supporter exposes an upper surface of the bending portion and covers an upper surface of the first and second flat portions, providing a coating portion on the base layer to overlap the bending portion by spraying a composition on the exposed upper surface of the bending portion, and separating the base layer, on which the coating portion is provided, from the supporter.

In an embodiment, the supporter may include a base portion, an outer support portion disposed on the base portion, and a protruding portion disposed on the base portion and spaced apart from the outer support portion to define a space. In such an embodiment, the first and second flat portions may be inserted into the space between the protruding portion and the outer support portion in a way such that the outer support portion covers the upper surface of the first and second flat portions, and the protruding portion may be protruded to correspond to an inner shape of the bending portion and supports the bending portion.

In an embodiment, the providing the coating portion on the base layer may include disposing a nozzle to correspond to a center portion of the bending portion overlapping the bending axis and spraying the composition to the center portion of the bending portion through the nozzle in a way such that a thickness of the coating portion gradually decreases as a distance from a center overlapping the bending axis increases.

According to embodiments of the invention, as described herein, the strength of the cover window may be improved, and thus, the strength of the display device including the cover window may be improved.

According to embodiments of the manufacturing method of the cover window, the thickness of the coating portion may be controlled, and the coating portion may be selectively formed only in a desired area, thereby providing the cover window having improved strength.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1A:
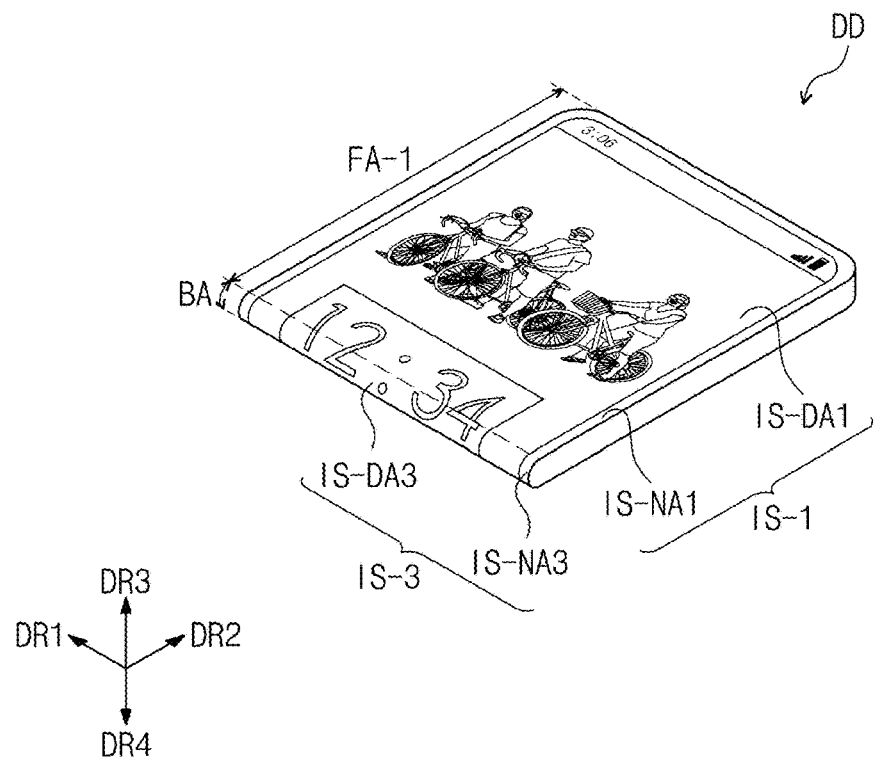
FIG. 1A is a perspective view showing a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "connected directly to" or "coupled directly to" another element, there are no intervening elements present.

Like numerals refer to like elements throughout. In the drawings, the thickness, ratio, and dimension of components are exaggerated for effective description of the technical content.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a cover window, a display device including the cover window, and a method of manufacturing the cover window will be described in detail with reference to the accompanying drawings.

Figure 1B:
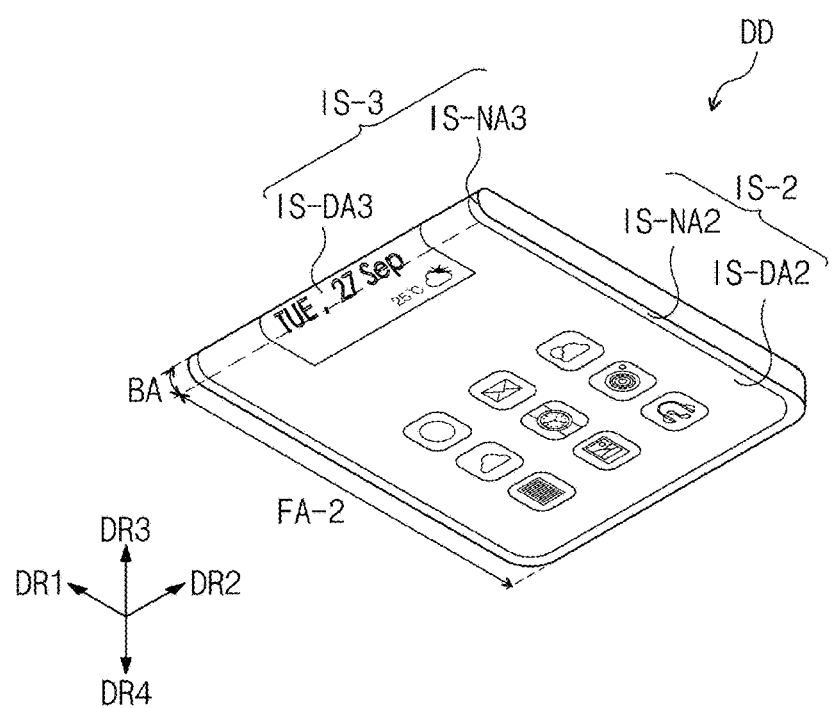
FIG. 1B is a perspective view showing a display device according to an embodiment of the disclosure.

FIGS. 1A and 1B are perspective views showing a display device DD according to an embodiment of the disclosure. An embodiment of the display device DD may include a plurality of display surfaces IS-1, IS-2, and IS-3. In such an embodiment, the display device DD may display an image through the display surfaces IS-1, IS-2, and IS-3.

In the accompanying drawings, first, second, third, and fourth directional axes DR1, DR2, DR3, and DR4 are shown, and directions indicated by a first to a fourth direction DR1 to DR4 are relative to each other and may be changed to other directions.

In the disclosure, the first direction DR1 and the second direction DR2 may be substantially perpendicular to each other, and each of the third direction DR3 and the fourth direction DR4 may be a normal line direction with respect to a plane defined by the first direction DR1 and the second direction DR2. The third direction DR3 and the fourth direction DR4 may be directions extending in opposite directions to each other.

FIGS. 1A and 1B are perspective views showing the display device DD viewed at different directions from each other. FIG. 1A is a perspective view showing the display device DD when viewed in the fourth direction DR4, and FIG. 1B is a perspective view showing the display device DD when viewed in the third direction DR3.

The display device DD may be a device activated in response to electrical signals. The display device DD may be various types of electronic device including a display panel. In one embodiment, for example, the display device DD may include a tablet computer, a notebook computer, a computer, a smart television, or the like. Hereinafter, for convenience of description, embodiments where the display device DD is a smartphone will be described in detail, but not being limited thereto.

The display device DD may include a first flat area FA-1 including the first display surface IS-1, a second flat area FA-2 including the second display surface IS-2, and a bending area BA including the third display surface IS-3. The bending area BA may be disposed between the first flat area FA-1 and the second flat area FA-2. The first flat area FA-1 may be spaced apart from the second flat area FA-2 with the bending area BA interposed therebetween.

In an embodiment, as shown in FIGS. 1A and 1B, the bending area BA may be in a shape of a curved surface, but not being limited thereto or thereby. The bending area BA may be disposed between the first flat area FA-1 and the second flat area FA-2 and may have a staple shape. The first flat area FA-1 and the second flat area FA-2 may be spaced apart from each other and may face each other in the third direction DR3.

The first display surface IS-1 may include a first display area IS-DA1 and a first peripheral area IS-NA1 adjacent to the first display area IS-DA1. The second display surface IS-2 may include a second display area IS-DA2 and a second peripheral area IS-NA2 adjacent to the second display area IS-DA2. The third display surface IS-3 may include a third display area IS-DA3 and a third peripheral area IS-NA3 adjacent to the third display area IS-DA3.

In such an embodiment, the display areas IS-DA1, IS-DA2, and IS-DA3 may be defined as an area through which the image is displayed, and the peripheral areas IS-NA1, IS-NA2, and IS-NA3 may be defined as an area through which the image is not displayed. The peripheral areas IS-NA1, IS-NA2, and IS-NA3 may be provided to have a variety of colors by a print layer. However, embodiments are not limited thereto or thereby, and alternatively, at least some of the peripheral areas IS-NA1, IS-NA2, and IS-NA3 may be omitted.

In an embodiment, the first display surface IS-1 may be substantially parallel to the plane defined by the first direction DR1 and the second direction DR2. The first display surface IS-1 may be a flat surface when viewed in a cross-section.

Herein, "when viewed in a cross-section" or "in a cross-section" may mean a case of being viewed in the first direction DR1 and "when viewed in a plane" or "in a plane" may mean a case of being viewed in the third direction DR3 or the fourth direction DR4. Hereinafter, front (or upper) and rear (or lower) surfaces of each layer or each member are distinguished from each other in the third directional axis DR3. The image may be provided to the third direction DR3 through the first display area IS-DA1 of the first display surface IS-1.

In such an embodiment, the second display surface IS-2 of the display device DD may be substantially parallel to the plane defined by the first direction DR1 and the second direction DR2. The second display surface IS-2 may be a flat surface when viewed in a cross-section. The second display surface IS-2 may be substantially parallel to the first display surface IS-1. The image may be provided to the fourth direction DR4 through the second display area IS-DA2 of the second display surface IS-2.

In such an embodiment, the third display surface IS-3 may be disposed between the first display surface IS-1 and the second display surface IS-2, and the first display surface IS-1 and the second display surface IS-2 may be bent at about 180° with respect to the third display surface IS-3. The third display area IS-DA3 of the third display surface IS-3 may provide the image to a direction opposite to the second direction DR2 between the third direction DR3 and the fourth direction DR4. The first display surface IS-1 and the second display surface IS-2 may be spaced apart from each other with the third display surface IS-3 interposed therebetween in the third direction DR3 or the fourth direction DR4.

In an embodiment, the first, second, and third display areas IS-DA1, IS-DA2, and IS-DA3 may display different images from each other. The images displayed through the first, second, and third display areas IS-DA1, IS-DA2, and IS-DA3 may be the same as each other or different from each other. In an embodiment, the images respectively displayed through the first, second, and third display areas IS-DA1, IS-DA2, and IS-DA3 may be joined together or "merged" to display a single unitary image. In an embodiment of the display device DD, as shown in FIGS. 1A and 1B, an image and a plurality of application icons are displayed respectively through the first display area IS-DA1 and the second display area IS-DA2, and a clock widget is displayed over the first, second, and third display areas IS-DA1, IS-DA2, and IS-DA3. The first, second, and third display areas IS-DA1, IS-DA2, and IS-DA3 may be respectively and independently controlled.

Figure 2:
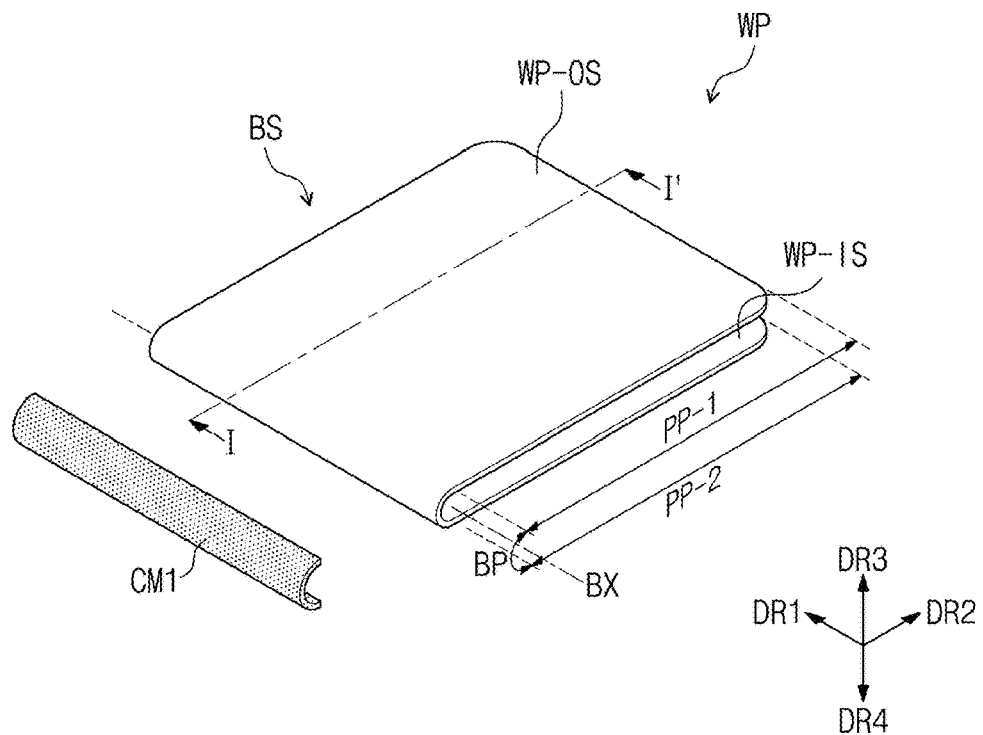
FIG. 2 is an exploded perspective view showing a cover window according to an embodiment of the disclosure.
Figure 3:
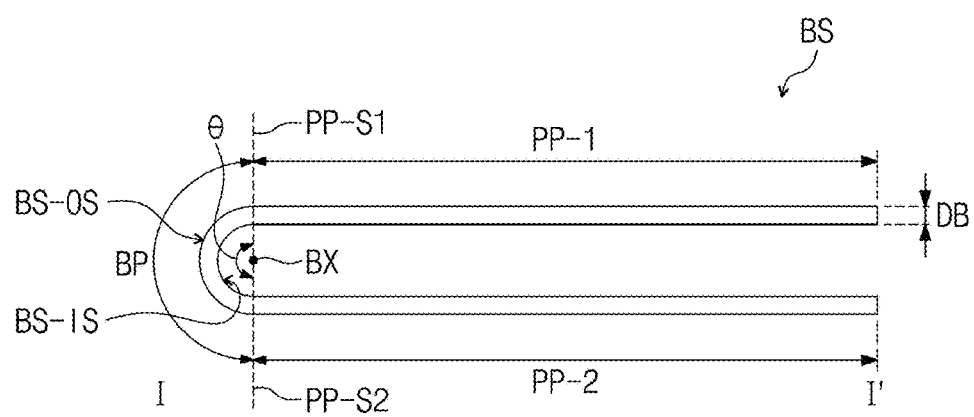
FIG. 3 is a cross-sectional view showing a base layer according to an embodiment of the disclosure.
Figure 3:
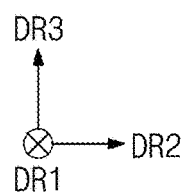

FIG. 2 is an exploded perspective view showing a cover window WP according to an embodiment of the disclosure. FIG. 3 is a cross-sectional view taken along a line I-I' to show a base layer BS included in the cover window WP shown in FIG. 2.

An embodiment of the cover window WP may be included in the display device DD shown in FIGS. 1A and 1B. The cover window WP may be an uppermost or outermost layer of the display device DD. A display panel DP (refer to FIG. 15) may be attached to an inner side WP-IS of the cover window WP. An outer side WP-OS of the cover window WP may correspond to the display surfaces IS-1, IS-2, and IS-3 (refer to FIG. 1A and FIG. 1B) of the display device DD.

In an embodiment, the cover window WP may include the base layer BS and one or more coating portions. The base layer BS includes a tempered surface and may stably protect the display panel DP (refer to FIG. 15) from external impacts. The coating portions may prevent the base layer BS from being damaged due to the external impacts.

The coating portions included in the cover window WP may be coating layers formed by spraying compositions of the coating portions on the base layer BS, but not being limited thereto or there. Alternatively, the coating portions may be provided on the base layer BS in a coating film form.

Referring to FIG. 2, an embodiment of the cover window WP may include the base layer BS and a first coating portion CM1. The first coating portion CM1 may be disposed to overlap a portion of the base layer BS.

Referring to FIGS. 2 and 3, the base layer BS may include a bending portion BP bent with respect to a bending axis BX extending in a direction substantially parallel to the first direction DR1 and first and second flat portions PP-1 and PP-2 disposed at opposing sides of the bending portion BP. The first flat portion PP-1 and the second flat portion PP-2 may be spaced apart from each other with the bending portion BP interposed therebetween.

In an embodiment of the base layer BS, the bending portion BP may be defined as a bent portion between a point where the first flat portion PP-1 begins and a point where the second flat portion PP-2 begins. For the convenience of illustration and description, FIGS. 2 to 12 show areas corresponding to the bending portion BP, the first flat portion PP-1, and the second flat portion PP-2.

In an embodiment, a bending angle θ of the bending portion BP may be defined as an included angle between a point PP-S1 where the first flat portion PP-1 begins and a point PP-S2 where the second flat portion PP-2 begins. In an embodiment, as shown in FIGS. 2 and 3, the bending angle θ in the base layer BS may be about 180°.

The first flat portion PP-1 and the second flat portion PP-2 may be spaced apart from each other and may face each other, for example, the first flat portion PP-1 and second flat portion PP-2 may face each other while being in parallel to each other. However, embodiments are not limited thereto or thereby, alternatively, and an extension surface of the first flat portion and an extension surface of the second flat portion may not be parallel to each other. In one embodiment, for example, a spaced distance between the extension surface of the first flat portion PP-1 and the extension surface of the second flat portion PP-2 may become closer to each other or may become father away from each other in an extension direction which is a direction away from the points PP-S1 and PP-S2 where the first and second flat portions PP-1 and PP-2 begin respectively.

In an embodiment, as shown in FIGS. 2 and 3, the first flat portion PP-1 and the second flat portion PP-2, which face each other, may have a same area as each other, but not being limited thereto or thereby. Alternatively, the first flat portion PP-1 and the second flat portion PP-2 may have different areas from each other. In an embodiment, as shown in FIGS. 2 and 3, the first flat portion PP-1 and the second flat portion PP-2, which face each other, have shapes symmetrical with each other with respect to the bending portion BP, but not being limited thereto or thereby. Alternatively, the first flat portion PP-1 and the second flat portion PP-2 may have different shapes from each other.

In an embodiment, the base layer BS may be rigid. In one alternative embodiment, for example, the base layer BS may include glass, and the glass may be provided with a tempered surface.

In an embodiment, the base layer BS may have a shape defined by the bending portion BP, the first flat portion PP-1, and the second flat portion PP-2, which are integrally formed with each other and bent. The first flat portion PP-1 and the second flat portion PP-2 may be fixed to be spaced apart from each other with the bending portion BP interposed therebetween and to face each other.

The base layer BS may have a thickness DB equal to or greater than about 0.1 millimeter (mm) and equal to less than about 1.0 mm. If the thickness DB of the base layer BS is too thin, the base layer BS may not effectively protect components disposed therein from the external impacts. If the thickness DB of the base layer BS is too thick, a thickness of the cover window WP and the display device DD in which the base layer BS is included becomes thick, which may impair portability.

The first coating portion CM1 may be disposed on the bending portion BP of the base layer BS. In FIG. 2, the first coating portion CM1 disposed on the bending portion BP is shown as being separated from the base layer BS, for convenience of illustration and description. In an embodiment, the first coating portion CM1 may be in contact with an upper surface of the bending portion BP of the base layer BS. The first coating portion CM1 may be disposed on the bending portion BP and may protect the bending portion BP that is relatively vulnerable to the external impacts when compared with the flat portions PP-1 and PP-2 of the base layer BS.

An inner side BS-IS of the base layer BS may correspond to the inner side WP-IS of the cover window WP. Accordingly, the display panel DP (refer to FIG. 15) may be attached to the inner side BS-IS of the base layer BS. One or more coating portions may be disposed on an outer side BS-OS of the base layer BS. The outer side BS-OS of the base layer BS disposed one or more coating portions may correspond to the outer side WP-OS of the cover window WP.

In an embodiment, although not shown in FIG. 2, the cover window WP may further include a print layer (not shown) disposed at an edge of the inner side WP-IS or the outer side WP-OS. In one embodiment, for example, the print layer (not shown) may be provided to correspond to the peripheral areas IS-NA1, IS-NA2, and IS-NA3 (refer to FIGS. 1A and 1B).

FIG. 2 shows an embodiment where the cover window WP includes the base layer BS and the first coating portion CM1, but not being limited thereto or thereby. According to alternative embodiments of the cover window WP, the shape, configuration, and arrangement of the coating portions may be variously modified, and FIGS. 4 to 12 show various embodiments of the coating portions CM1, CM2, and CM3. In such embodiments shown in FIGS. 4 to 12, a base layer BS is substantially the same as the base layer BS described with reference to FIGS. 2 and 3, and hereinafter, the coating portions CM1, CM2, CM3 will be mainly described with reference to FIGS. 4 to 12.

FIGS. 4 to 7 show a cover window WP-a including a first coating portion CM1 disposed on a bending portion BP. FIGS. 8 to 12 show embodiments of a cover window WP-b, WP-c, or WP-d including a coating portion CM1, CM2, or CM3 disposed on the base layer BS. Referring to FIGS. 4 to 7, an embodiment of the cover window WP-a may include the base layer BS and the first coating portion CM1.

The first coating portion CM1 may be disposed on a portion of the base layer BS. The first coating portion CM1 may be disposed on the bending portion BP. The first coating portion CM1 may be disposed to cover an entire area of the bending portion BP, but not being limited thereto or thereby. Alternatively, the first coating portion CM1 may be disposed to overlap only a portion of the bending portion BP. In an embodiment, the first coating portion CM1 may have a uniform thickness, but not being limited thereto or thereby. Alternatively, the first coating portion CM1 may have different thicknesses depending on portions thereof.

In an embodiment, the first coating portion CM1 may be coated directly on the bending portion BP and may be in contact with the bending portion BP, but not being limited thereto or thereby. Alternatively, the first coating portion CM1 may be attached to an upper surface of the bending portion BP in a coating film form. The first coating portion CM1 may cover the bending portion BP to protect the bending portion BP that is vulnerable to the external impacts.

In an embodiment, the first coating portion CM1 may have a first modulus. The first modulus may be less than a modulus of the base layer BS. As the first coating portion CM1 has the modulus less than that of the base layer BS, the first coating portion CM1 may effectively absorb the external impacts.

The first coating portion CM1 may include an organic material. In one embodiment, for example, the first coating portion CM1 may include polypropylene, polyethylene, or polyethylene terephthalate, but materials of the first coating portion CM1 are not be limited thereto or thereby.

The first coating portion CM1 may include a transparent material. In an embodiment of the display device DD (refer to FIG. 1A), the first coating portion CM1 may be disposed to overlap the third display area IS-DA3 (refer to FIG. 1A) included in the display device DD (refer to FIG. 1A). The image displayed through the third display area IS-DA3 (refer to FIG. 1A) may be perceived by the user after passing through the first coating portion CM1 that is optically transparent.

In an embodiment, the cover window WP-a including the first coating portion CM1 disposed on the portion of the base layer BS, which overlaps the bending portion BP, may be disposed on the display panel DP (refer to FIG. 15) and may protect the bending portion BP that is relatively vulnerable to the external impacts when compared with the flat portions PP-1 and PP-2. In such an embodiment, the image provided by the display panel DP (refer to FIG. 15) may be more clearly displayed through the area that does not overlap the first coating portion CM1.

Figure 4:
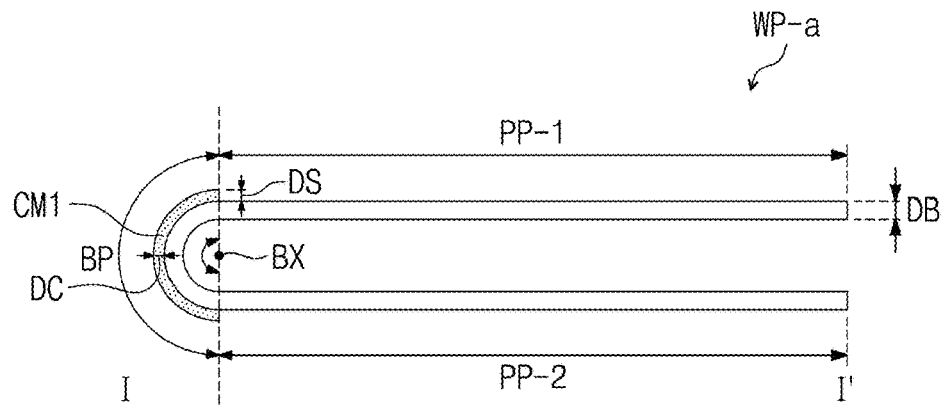
FIG. 4 is a cross-sectional view showing a cover window according to an embodiment of the disclosure.
Figure 4:
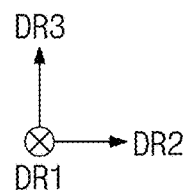
Figure 5:
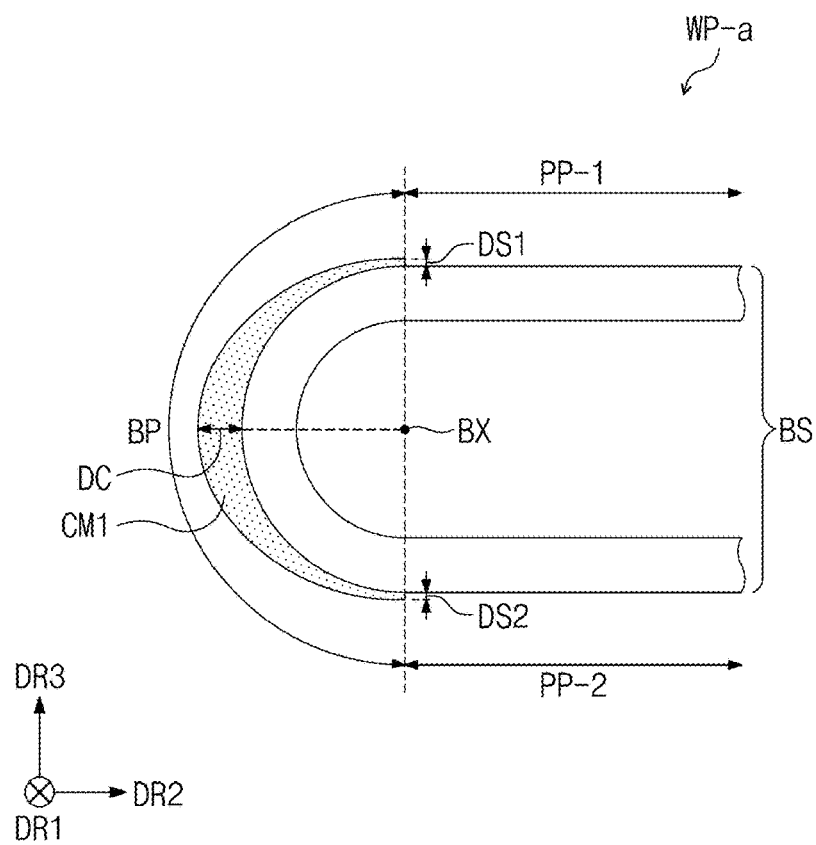
FIG. 5 is a cross-sectional view showing a cover window according to an embodiment of the disclosure.
Figure 6:
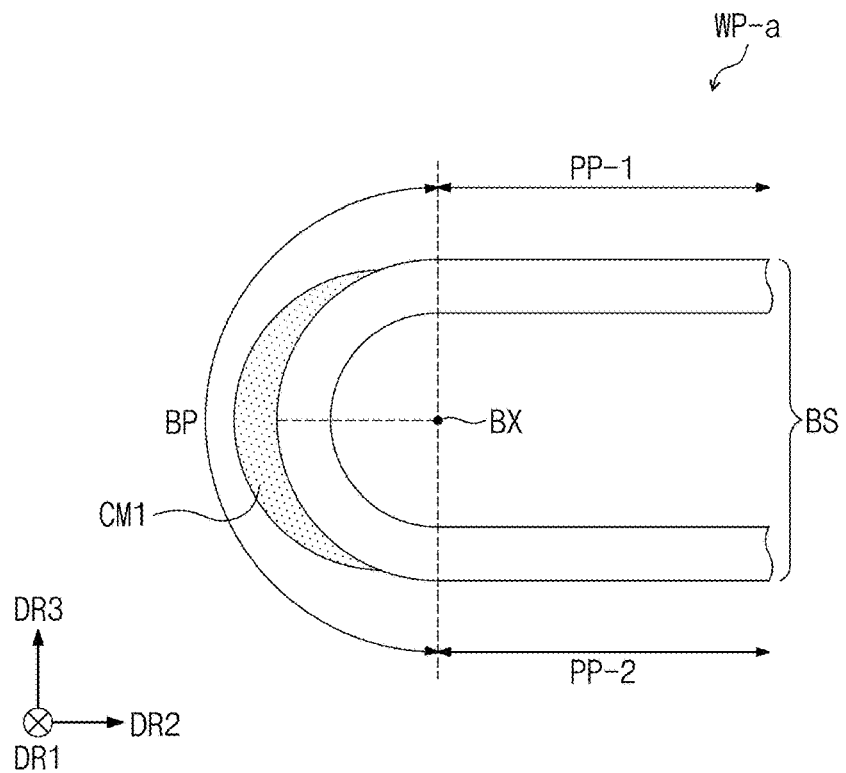
FIG. 6 is a cross-sectional view showing a cover window according to an embodiment of the disclosure.

Referring to FIGS. 4 and 5, in an embodiment, the first coating portion CM1 may overlap the bending portion BP and may not overlap the first flat portion PP-1 and the second flat portion PP-2. The outer side WP-OS (refer to FIG. 2) of the cover window WP-a, which overlaps the bending portion BP, may correspond to an outer side of the first coating portion CM1. The outer side WP-OS (refer to FIG. 2) of the cover window WP-a, which overlaps the first flat portion PP-1 and the second flat portion PP-2, may correspond to the outer side BS-OS (refer to FIG. 3) of the base layer BS except the bending portion BP. Referring to FIG. 6, in an alternative embodiment, the first coating portion CM1 may be disposed to overlap only a portion of the bending portion BP. In such an embodiment, the first coating portion CM1 may cover only the portion of the bending portion BP, which is the most vulnerable to the external impacts.

Figure 7:
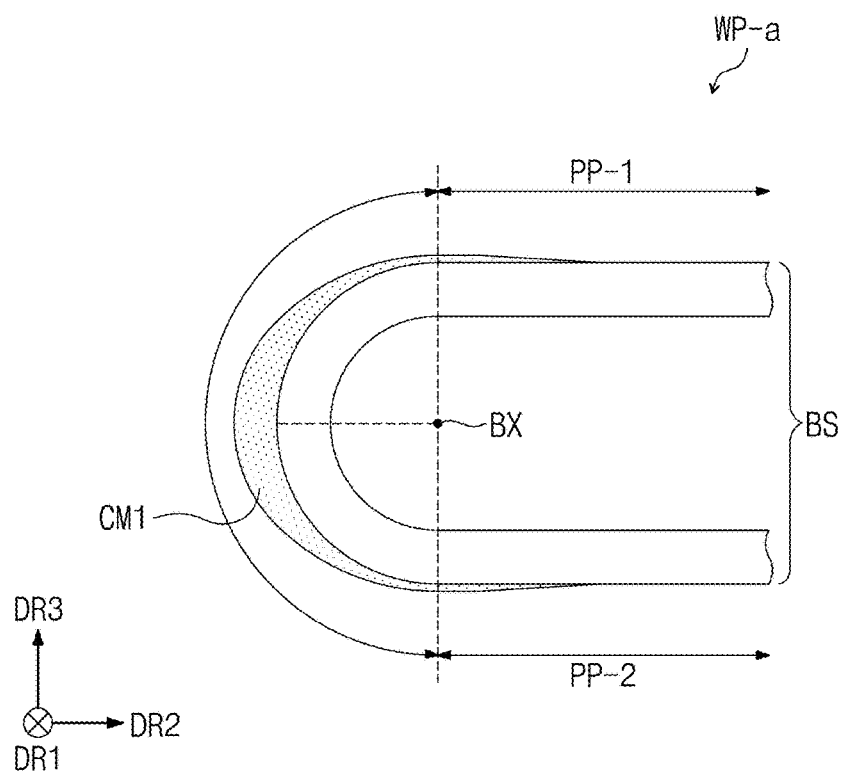
FIG. 7 is a cross-sectional view showing a cover window according to an embodiment of the disclosure.

Referring to FIG. 7, in another alternative embodiment, the first coating portion CM1 may overlap the bending portion BP and a portion of each of the first flat portion PP-1 and the second flat portion PP-2. In such an embodiment, the first coating portion CM1 may cover and protect the upper surface of the bending portion BP, a boundary between the bending portion BP and the first flat portion PP-1, and a boundary between the bending portion BP and the second flat portion PP-2.

Referring back to FIG. 4, in an embodiment, the first coating portion CM1 may have the uniform thickness. In such an embodiment, a center portion thickness DC of the first coating portion CM1, which overlaps the bending axis BX in the second direction DR2, may be substantially the same as a thickness DS at an end of the first coating portion CM1. The center portion thickness DC of the first coating portion CM1 may be, for example, equal to or greater than about 50 micrometers (μm), may be equal to or greater than about 50 μm and equal to or less than about 300 μm. In one embodiment, for example, center portion thickness DC of the first coating portion CM1 may be equal to or greater than about 50 μm and equal to or less than about 150 μm.

Referring to FIGS. 5 to 7, in an embodiment, the thickness of the first coating portion CM1 included in the cover window WP-a may not be uniform. For the convenience of illustration and description, a portion in cross-section of the cover window WP-a is shown enlarged or exaggerated in FIG. 5.

Referring to FIG. 5, in an embodiment, the thickness DC of the center portion of the first coating portion CM1 overlapping the bending axis BX may be greater than thicknesses DS1 and DS2 of both ends of the first coating portion CM1, which are opposite to each other. The center portion of the bending portion BP, which is relatively vulnerable to the external impacts, may be effectively protected by allowing the thickness DC of the center portion of the first coating portion CM1, which overlaps the center portion of the bending portion BP, to be thicker.

The center portion thickness DC of the first coating portion CM1 may be equal to or greater than about 50 μm, and may be equal to or greater than about 50 μm and equal to or less than about 300 μm. In one embodiment, for example, the center portion thickness DC of the first coating portion CM1 may be equal to or greater than about 50 μm and equal to or less than about 150 μm. As the thickness of the coating portion increases, an amount of impact absorption increases, and thus, the base layer BS may be effectively protected from the external impacts. However, when the thickness of the coating portion is too thick, aesthetic impression may be poor, and when the cover window WP is disposed on the display panel DP (refer to FIG. 15), the coating portion may exert an influence on clarity of the image provided through the display panel DP (refer to FIG. 15).

In an embodiment, the thickness of the first coating portion CM1 may gradually decrease from a center to opposing end portions of the first coating portion CM1. In one embodiment, for example, the first coating portion CM1 may be smooth coated without having a step difference with respect to the base layer BS. The bending portion BP may be protected while maintaining the aesthetic impression of cover window WP-a by smoothly coating the first coating portion CM1 without having the step difference with respect to the base layer BS.

Figure 8:
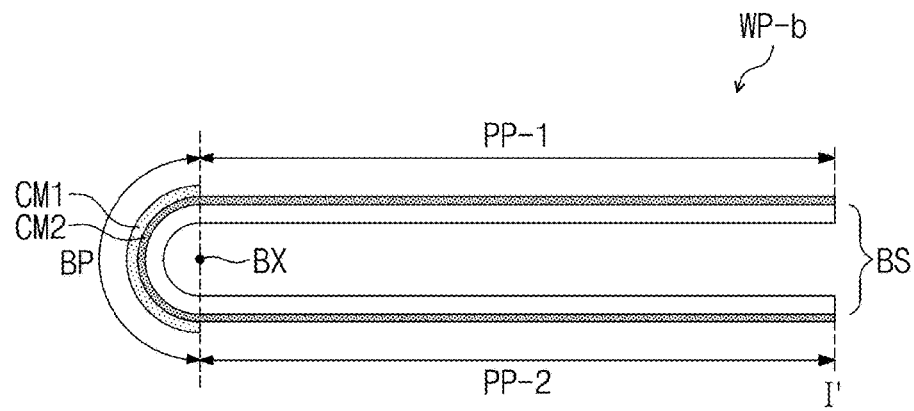
FIG. 8 is a cross-sectional view showing a cover window according to an embodiment of the disclosure.
Figure 8:
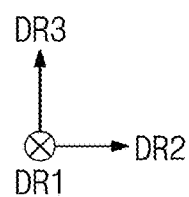
Figure 9:
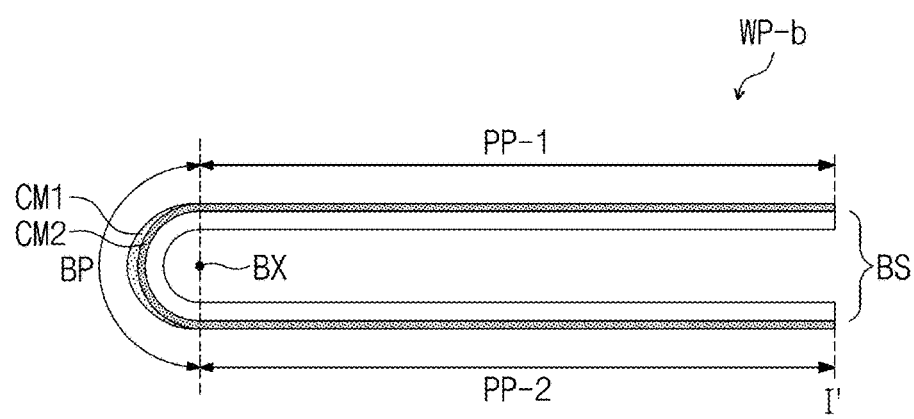
FIG. 9 is a cross-sectional view showing a cover window according to an embodiment of the disclosure.
Figure 9:
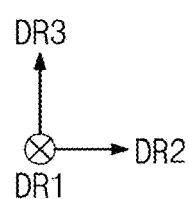
Figure 10:
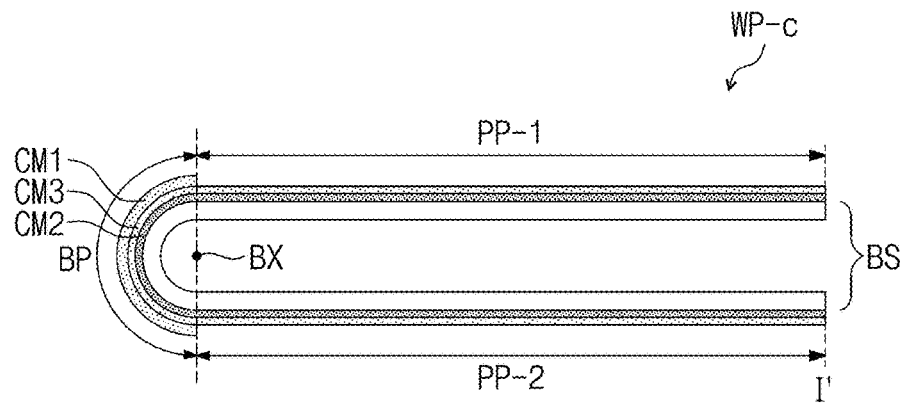
FIG. 10 is a cross-sectional view showing a cover window according to an embodiment of the disclosure.
Figure 10:
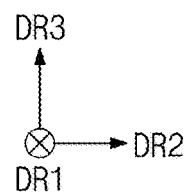
Figure 11:
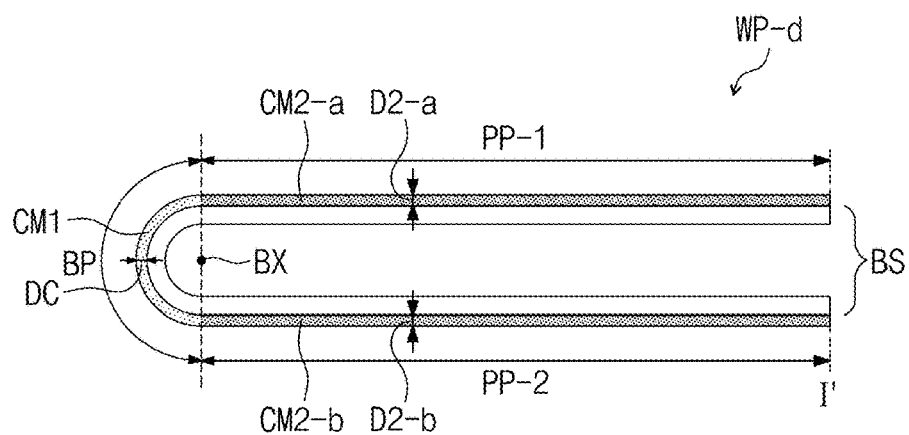
FIG. 11 is a cross-sectional view showing a cover window according to an embodiment of the disclosure.
Figure 11:
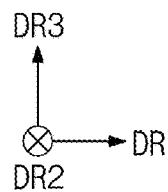
Figure 12:
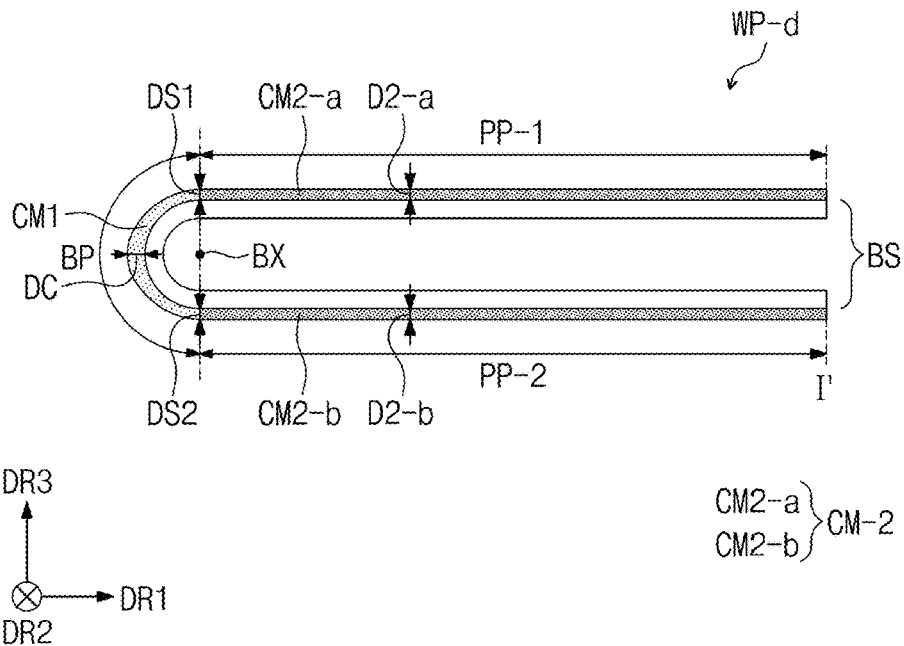
FIG. 12 is a cross-sectional view showing a cover window according to an embodiment of the disclosure.

In an embodiment, as shown in FIGS. 8 to 10, the cover windows WP-b, WP-c, and WP-d may include all or some of the coating portions CM1, CM2, and CM3 disposed on the base layer BS. FIGS. 8 and 9 show an embodiment of the cover window WP-b including first and second coating portions CM1 and CM2. FIG. 10 shows an embodiment of the cover window WP-c including first, second, and third coating portions CM1, CM2, and CM3. FIGS. 11 and 12 shows an embodiment of the cover window WP-d that includes a first coating portion CM1 and a second coating portion CM2 including a plurality of sub-coating portions CM2-a and CM2-b.

In such an embodiment, the coating portion CM1, CM2, or CM3 may be the coating layers formed by spraying compositions for the coating portions CM1, CM2, and CM3 on the base layer BS, but not being limited thereto or thereby. Alternatively, at least some of the coating portions CM1, CM2, and CM3 may be provided in a coating film form.

In an embodiment, as shown in FIGS. 8 and 9, the cover windows WP-b may further include the second coating portion CM2. The cover windows WP-b shown in FIGS. 8 and 9 may be substantially the same as each other except for the shape of the first coating portion CM1. In such an embodiment, the first coating portion CM1 of the cover windows WP-b is substantially the same as the first coating portion CM1 described above with reference to FIGS. 4 to 7, and repetitive detailed description of the same features of the first coating portion CM1 will hereinafter be omitted or simplified.

The first coating portion CM1 may be disposed on the second coating portion CM2 to overlap the bending portion BP. Accordingly, the second coating portion CM2 and the first coating portion CM1 may be sequentially stacked on the bending portion BP, and the coating portion that protects the bending portion BP may have a thickness greater than a thickness of the coating portion that protects the first flat portion PP-1 and the second flat portion PP-2. In an embodiment of the cover window WP-b, upper surfaces of the first flat portion PP-1 and second flat portion PP-2 of the base layer BS may be protected by the second coating portion CM2, and the bending portion BP that is relatively vulnerable to the external impacts may be effectively protected by the first coating portion CM1 and the second coating portion CM2.

The first coating portion CM1 may have a first modulus, and the second coating portion CM2 may have a second modulus. In an embodiment, the second modulus may be equal to or greater than the first modulus and may be less than a modulus of the base layer BS. In such an embodiment, where the second modulus is greater than the first modulus, the external impacts absorbed by the first coating portion CM1 may be dispersed in the second coating portion CM2.

The second coating portion CM2 may include an organic material. In one embodiment, for example, the second coating portion CM2 may include polypropylene, polyethylene, or polyethylene terephthalate, but not being limited thereto or thereby.

The second coating portion CM2 may include a transparent material. In an embodiment of the display device DD (refer to FIG. 1A), the second coating portion CM2 may be disposed to overlap the first, second, and third display areas IS-DA1, IS-DA2, and IS-DA3 (refer to FIGS. 1A and 1B). The image displayed through the first, second, and third display areas IS-DA1, IS-DA2, and IS-DA3 (refer to FIGS. 1A and 1B) may be perceived by the user after passing through the second coating portion CM2 that is optically transparent.

The second coating portion CM2 may include a same material as or a different material from that of the first coating portion CM1. In an embodiment, a lower surface of the first coating portion CM1 may be in contact with the second coating portion CM2 and may be integrally formed with the second coating portion CM2. In such an embodiment, the cover window may include the coating portion having a single unitary shape in which a portion thereof overlapping the bending portion BP has a relatively thick thickness. The second coating portion CM2 may include a same material as that of the first coating portion CM1, however, may have different physical properties from those of the first coating portion CM1. In one embodiment, for example, where the coating portions include a same materials, hardness of the material may be varied depending on a molecular arrangement of the material. In such an embodiment, the second coating portion CM2 may include a same material as that of the first coating portion CM1, but may have different modulus from that of the first coating portion CM1.

In an embodiment, as shown in FIG. 8, the first coating portion CM1 may have a uniform thickness, as the first coating portion CM1 described above with reference to FIG. 4. In an alternative embodiment, as shown in FIG. 9, the first coating portion CM1 may have different thicknesses depending on areas thereof, as the first coating portion CM1 described above with reference to FIG. 5. In such an embodiment, as shown in FIG. 9, the first coating portion CM1 may be in contact with the second coating portion CM2 and may be coated without a step difference with respect to the second coating portion CM2.

In another alternative embodiment, as shown in FIG. 10, the cover window WP-c may further include a third coating portion CM3 disposed on the second coating portion CM2. The third coating portion CM3 may be disposed between the first coating portion CM1 and the second coating portion CM2. The second coating portion CM2 may cover the upper surface of the base layer BS, and the third coating portion CM3 may cover the upper surface of the second coating portion CM2. In such an embodiment, the first coating portion CM1 is not be particularly limited, and the first coating portion CM1 shown in FIG. 10 may be substantially the same as one of the embodiments of the first coating portion CM1 described above with reference to FIGS. 4 to 7.

Referring to FIG. 10, the third coating portion CM3 may have a modulus equal to a modulus of the first coating portion CM1 and less than a modulus of the second coating portion CM2. Accordingly, in such an embodiment, the cover window WP-c may include coating portions CM1, CM2, and CM3 covering the base layer BS and having two different moduli. The first coating portion CM1 and the third coating portion CM3, which have a relatively small modulus, may absorb the external impacts, and the second coating portion CM2 having a relatively large modulus may disperse the external impacts absorbed by the first coating portion CM1 and the third coating portion CM3.

In an embodiment, the second coating portion CM2, the third coating portion CM3, and the first coating portion CM1 may be sequentially stacked on the bending portion BP, and the second coating portion CM2 and the third coating portion CM3 may be sequentially stacked on the first flat portion PP-1 and the second flat portion PP-2. Accordingly, the coating portion that protects the bending portion BP may have the thickness greater than the thickness of the coating portion that protects the first flat portion PP-1 and the second flat portion PP-2. The bending portion BP that is relatively more vulnerable to the external impacts may be effectively protected by the first, second, and third coating portions CM1, CM2, and CM3.

In an embodiment, as shown in FIGS. 8 to 10, the cover window WP-b or WP-c may include the coating portions in which a portion thereof overlapping the bending portion BP has a thickness greater than a thickness of a portion thereof overlapping the flat portions PP-1 and PP-2 due to the coating portions CM1, CM2, and CM3 disposed on the base layer BS. In such an embodiment, the cover window WP-b or WP-c may include the coating portions having different moduli from each other due to the coating portions CM1, CM2, and CM3 disposed on the base layer BS. Accordingly, the coating portion CM1, CM2, and CM3 may improve the strength of the cover window WP-b or WP-c, and particularly, may effectively improve the strength of the bending portion BP that is vulnerable to the external impacts.

In another alternative embodiment, as shown in FIGS. 11 and 12, the second coating portion CM2 included in each of the cover windows WP-d may include a plurality of sub-coating portions CM2-$a$ and CM2-$b$. The embodiments of the cover window WP-d shown in FIG. 12 may have substantially the same as the embodiment of the cover window WP-d shown in FIG. 11 except for the shape of the first coating portion CM1. In such embodiments, the first coating portion CM1 is substantially the same as the first coating portion CM1 described above with reference to FIGS. 4 to 7, and hereinafter, features of the cover windows WP-d different from those described above will be mainly described with reference to FIGS. 11 and 12.

Referring to FIGS. 11 and 12, in an embodiment, the second coating portion CM2 may include a first sub-coating portion CM2-$a$ disposed on the first flat portion PP-1 and a second sub-coating portion CM2-$b$ disposed on the second flat portion PP-2. The first sub-coating portion CM2-$a$ and the second sub-coating portion CM2-$b$ may be spaced apart from each other with the first coating portion CM1 interposed therebetween.

The first sub-coating portion CM2-$a$ may be in contact with one side of the first coating portion CM1, and the second sub-coating portion CM2-$b$ may be in contact with the other side of the first coating portion CM1. The first coating portion CM1 may have a thickness DC that is substantially the same as thicknesses D2-$a$ and D2-$b$ of the first and second sub-coating portions CM2-$a$ and CM2-$b$. The first coating portion CM1, the first sub-coating portion CM2-$a$, and the second sub-coating portion CM2-$b$ may be provided in a single unitary form and may collectively define a same layer as each other.

The first coating portion CM1 may have a first modulus, and the second coating portion CM2 may have a second modulus. Accordingly, each of the first sub-coating portion CM2-$a$ and the second sub-coating portion CM2-$b$, which are included in the second coating portion CM2, may have the second modulus. In such an embodiment, the second modulus may be equal to or greater than the first modulus. In such an embodiment, the second modulus may be less than the modulus of the base layer BS. In such an embodiment, the first coating portion CM1, the first sub-coating portion CM2-$a$, and the second sub-coating portion CM2-$b$ may absorb the external impacts. In such an embodiment, where the second modulus is greater than the first modulus, the external impacts absorbed by the first coating portion CM1 may be dispersed in each of the first sub-coating portion CM2-$a$ and the second sub-coating portion CM2-$b$.

Each of the first and second sub-coating portions CM2-$a$ and CM2-$b$ may include an organic material. In one embodiment, for example, the first and second sub-coating portions CM2-$a$ and CM2-$b$ may include polypropylene, polyethylene, or polyethylene terephthalate, but not being limited thereto or thereby.

The first coating portion CM1, and each of the first and second sub-coating portions CM2-$a$ and CM2-$b$ may include a transparent material. In an embodiment of the display device DD (refer to FIG. 1A), the first coating portion CM1 may be disposed to overlap the third display area IS-DA3 (refer to FIG. 1A), the first sub-coating portion CM2-*a* may be disposed to overlap the first display area IS-DA1 (refer to FIG. 1A), and the second sub-coating portion CM2-*b* may be disposed to overlap the second display area IS-DA2 (refer to FIG. 1B). In such an embodiment, the image displayed through the first, second, and third display areas IS-DA1, IS-DA2, and IS-DA3 (refer to FIGS. 1A and 1B) may be perceived by the user through the first coating portion CM1 and the first to second sub-coating portions CM2-*a* and CM2-*b*.

Each of the first and second sub-coating portions CM2-*a* and CM2-*b* may include a same material as or a different material from that of the first coating portion CM1. Each of the first and second sub-coating portions CM2-*a* and CM2-*b* may include a same material as that of the first coating portion CM1, but may have different physical properties from the first coating portion CM1. In one embodiment, for example, each of the first and second sub-coating portions CM2-*a* and CM2-*b* may include a same material as that of the first coating portion CM1, but, may have a modulus different from that of the first coating portion CM1. Accordingly, in such an embodiment, the coating portion may have a single unitary shape, but the coating portion may have different moduli depending on areas thereof.

In an embodiment, as shown in FIG. 11, the first coating portion CM1 may have a uniform thickness, as the first coating portion CM1 described above with reference to FIG. 4. In an alternative embodiment, as shown in FIG. 12, the first coating portion CM1 may have different thicknesses depending on areas thereof, as the first coating portion CM1 described above with reference to FIG. 5. Accordingly, a thickness DC of the center portion of the first coating portion CM1 shown in FIG. 12 may be different from a thickness DS1 of one side of the first coating portion CM1 that makes contact with the first sub-coating portion CM2-*a* and a thickness DS2 of the other side of the first coating portion CM1 that makes contact with the second sub-coating portion CM2-*b*, and the thickness DC of the center portion of the first coating portion CM1 may be greater than the thicknesses DS1 and DS2 of one side and the other side of the first coating portion CM1.

Referring to FIG. 12, a thickness DC of the center portion of the first coating portion CM1 overlapping the bending axis BX may be different from thicknesses DS1 and DS2 of opposite ends of the first coating portion CM1. The thickness DC of the center portion of the first coating portion CM1 may be greater than the thickness DS1 of the one side of the first coating portion CM1, which makes contact with the first sub-coating portion CM2-*a*, and the thickness DS2 of the other side of the first coating portion CM1, which makes contact with the second sub-coating portion CM2-*b*. The thickness DS1 of the one side of the first coating portion CM1 may be equal to a thickness of the first sub-coating portion CM2-*a*, and the thickness DS2 of the other side of the first coating portion CM1 may be equal to a thickness of the second sub-coating portion CM2-*b*. In such an embodiment, the coating portion may have a single unitary shape, may have the greatest thickness in the center portion of the first coating portion CM1, and may have different moduli depending on areas thereof.

Figure 13:
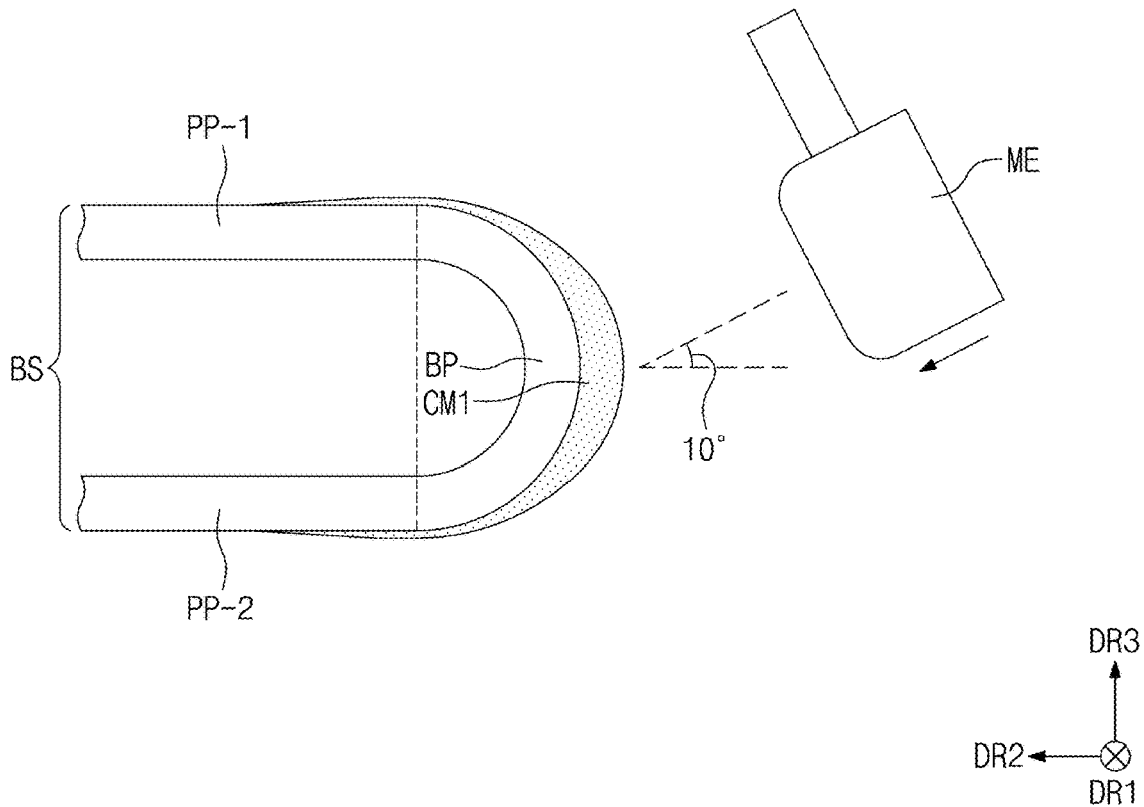
FIG. 13 is a cross-sectional view showing a Charpy impact test applied to a cover window according to an embodiment of the disclosure.

FIG. 13 is a cross-sectional view showing a Charpy impact test applied to evaluate the cover window according to an embodiment of the disclosure. As a first process of the evaluation method of the disclosure, a metal pendulum ME is fixed to apply the impact to the coating portion CM1 disposed on bending portion BP of the cover window WP. In this evaluation method, the metal pendulum ME is fixed such that an angle between a center of the bending portion BP and a center of the metal pendulum ME becomes about 10° with respect to the second direction DR2. Then, the metal pendulum ME is released so that the impact is applied to the coating portion CM1.

In the evaluation method, the absorbed energy according to the thickness of the coating portion CM1 is measured while changing a weight of the metal pendulum ME and a thickness of the coating portion CM1. In the evaluation method, the energy absorbed by the coating portion CM1 containing polypropylene is measured during an impact time of about 0.02 seconds.

Table 1 below shows results of Charpy impact test with respect to the cover window. In Table 1, "the degree of strength improvement" is a result showing how much the strength of the cover window including the first coating portion has increased when comparing the degree of impact absorption of the cover window without the first coating portion and the degree of impact absorption of the cover window including the first coating portion.

Figure 14:
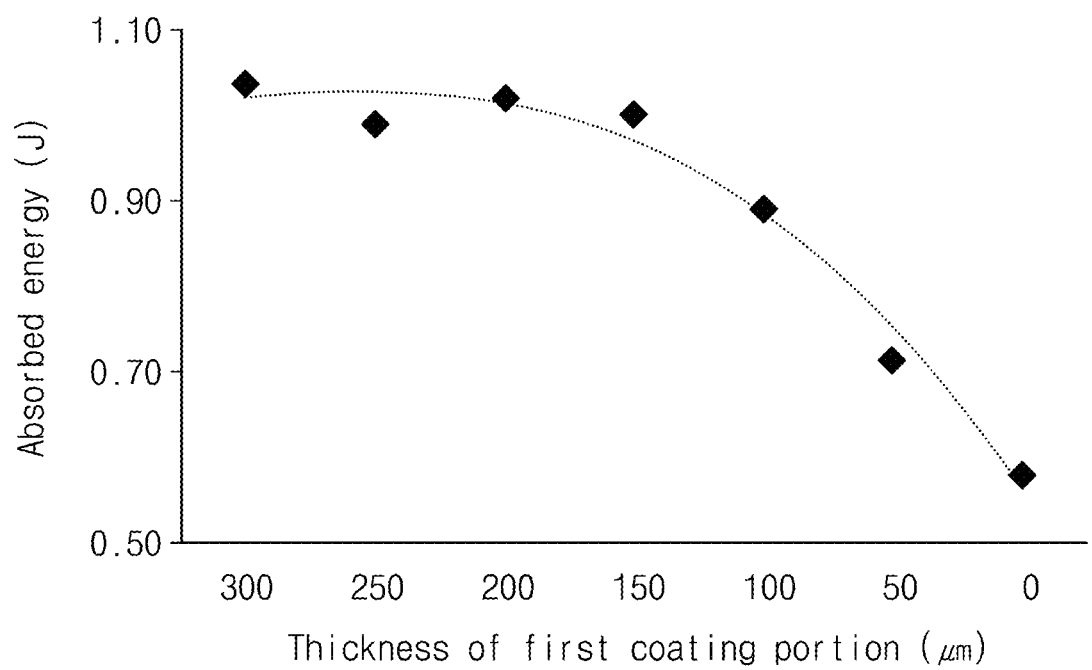
FIG. 14 is a graph showing an absorbed energy versus a thickness of a first coating portion of a cover window according to an embodiment of the disclosure.

FIG. 14 is a graph showing the absorbed energy versus the thickness of the first coating portion shown in Table 1.

TABLE 1

| Thickness of first coating portion (μm) | 300 | 250 | 200 | 150 | 100 | 50 | 0 |
|---|---|---|---|---|---|---|---|
| Weight of impactor (Kgf) | 2.70 | 2.57 | 2.65 | 2.60 | 2.31 | 1.86 | 1.51 |
| Absorbed energy (J) | 1.04 | 0.99 | 1.02 | 1.00 | 0.89 | 0.71 | 0.58 |
| Degree of strength improvement (%) | 179 | 171 | 176 | 173 | 154 | 123 | — |

Referring to Table 1, the absorbed energy of the cover window with the first coating portion is greater than that of the cover window without the first coating portion, and the strength of the cover window with the first coating portion is improved when compared with the strength of the cover window without the first coating portion. When the thickness of the first coating portion is equal to or greater than about 50 μm, the strength is improved by about 123% compared with the cover window that does not include the first coating portion.

In addition, referring to FIG. 14, the absorbed energy and the degree of strength improvement of the cover window are increased as the thickness increases in a thickness range from about 50 μm to about 150 μm. Accordingly, in an embodiment of the invention, the thickness of the first coating portion used to improve the strength of the cover window may be equal to or greater than about 50 μm. As the cover window having improved strength is provided, the display panel disposed under the cover window may be effectively protected from the external impacts.

Referring to FIG. 14 and Table 1, the absorbed energy and the degree of the strength improvement increase as the thickness of the first coating portion increases, and the absorbed energy and the degree of the strength improvement show similar results when the thickness of the first coating portion is equal to or greater than about 150 μm. In an embodiment where the thickness of the first coating portion is equal to or greater than about 150 µm, the absorbed energy has a value of about 1 joule (J), and the degree of strength improvement is in a range of about 170% to about 180%. In such an embodiment, the thickness of the first coating portion may be equal to or greater than about 50 µm to improve the strength of the cover window, and the thickness of the first coating portion may be equal to or less than about 300 µm by taking into account the thinning of the cover window, aesthetic impression, and a material cost of the coating portion. Accordingly, in an embodiment of the invention, the thickness of the first coating portion may be equal to or greater than about 50 µm and equal to or less than about 150 µm.

Figure 15:
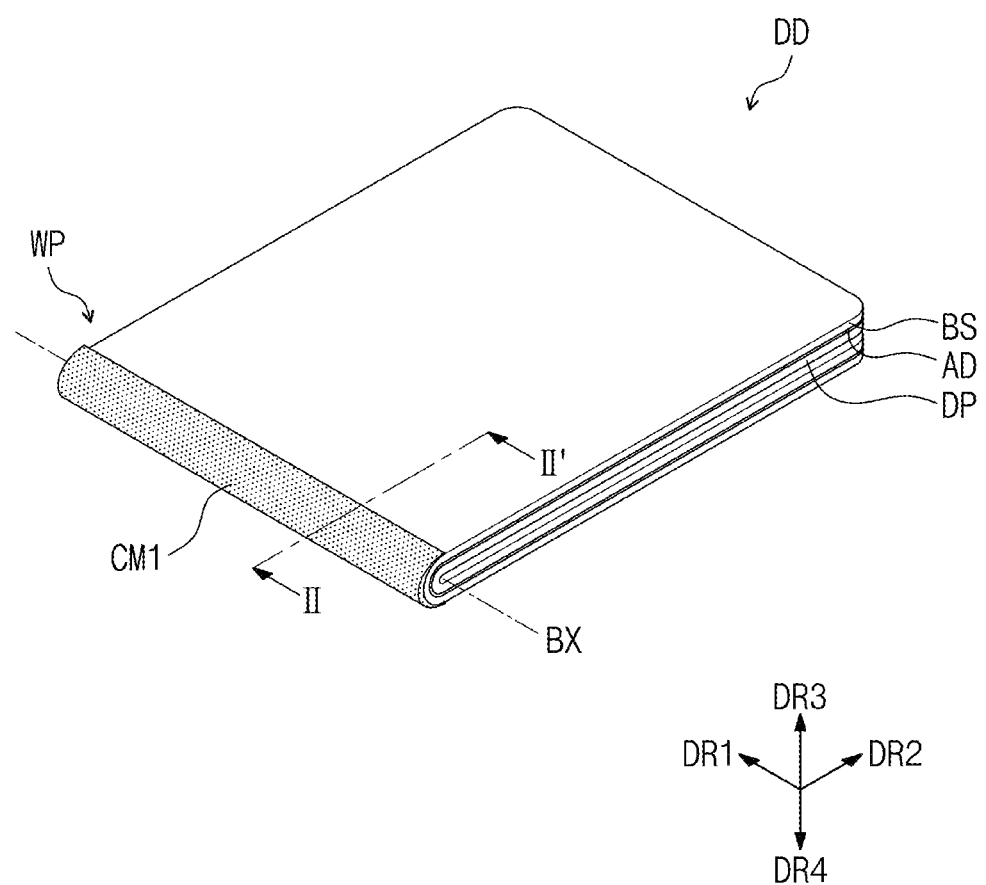
FIG. 15 is a perspective view showing a display device according to an embodiment of the disclosure.

FIG. 15 is a perspective view showing a display device DD according to an embodiment of the disclosure. An embodiment of the display device DD may include a display panel DP, an adhesive layer AD, and a cover window WP. The display panel DP may be disposed on an inner side WP-IS (refer to FIG. 3) of the cover window WP with the adhesive layer AD interposed therebetween.

In an embodiment, the cover window WP may include a base layer BS and at least one coating portion CM1. In such an embodiment, the coating portion CM1 may improve the strength of the cover window WP and may protect the display panel DP disposed on the inner side of the cover window WP. In such an embodiment, the cover window WP is substantially the same as the cover window described above with reference to FIGS. 2 to 12, and any repetitive detailed description thereof will be omitted or simplified.

The display panel DP may output the image displayed through the display device DD. In an embodiment, the display panel DP may be a light emitting type display panel, but not being particularly limited. In one embodiment, for example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, for convenience of description, embodiments where the display panel DP is the organic light emitting display panel will be described in detail. In such embodiments, the display panel DP may be a flexible display panel, and thus, may have a bent shape.

The adhesive layer AD may be disposed between the display panel DP and the cover window WP to attach the cover window WP to the display panel DP. The adhesive layer AD may include an optically clear adhesive ("OCA"), but not being limited thereto or thereby.

In an embodiment, although not shown in figures, the display device DD may further include a case to accommodate the display panel DP, and thus, as shown in FIGS. 1A and 1B, the display panel may be accommodated in the case.

Figure 16:
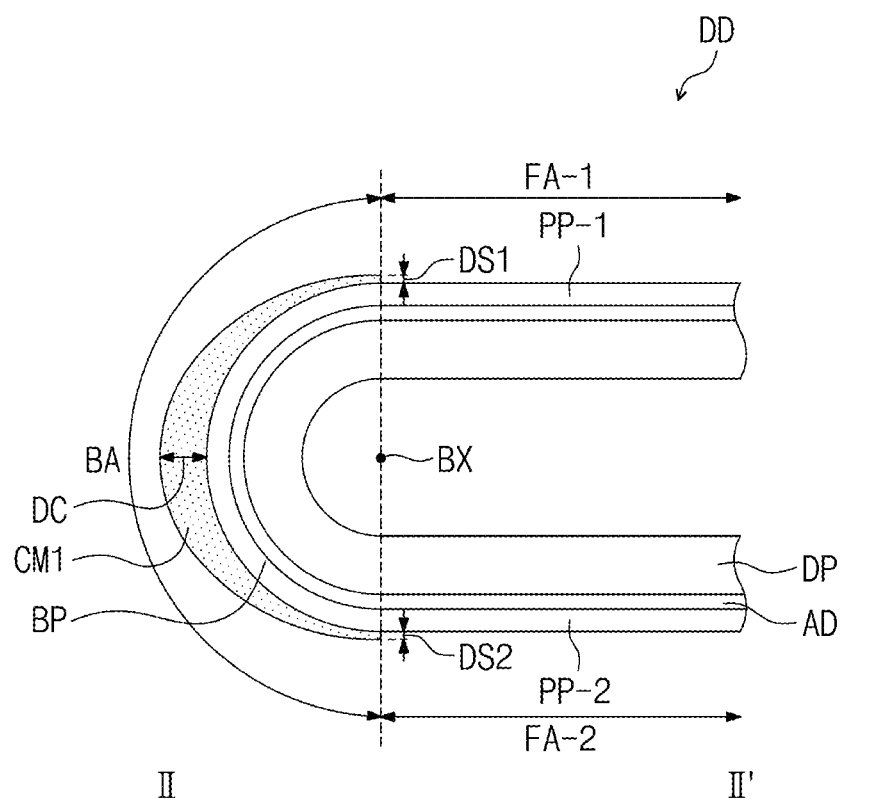
FIG. 16 is a cross-sectional view showing a display device according to an embodiment of the disclosure.

FIG. 16 is a cross-sectional view taken along line II-IF shown in FIG. 15. In an embodiment, the display panel DP may include a bending area BA bent about a bending axis BX extending in a direction substantially parallel to the first direction DR1, a first flat area FA-1, and a second flat area FA-2 spaced apart from the first flat area FA-1 with the bending area BA interposed therebetween. The first flat area FA-1 may face the second flat area FA-2 in the third direction DR3.

In such an embodiment, the cover window WP may be disposed on the display panel DP with the adhesive layer AD interposed therebetween. The cover window WP may include the base layer BS and the coating portion CM1 disposed on the base layer BS, but not being limited thereto. Alternatively, the cover window WP may be variously modified as the embodiments described above with reference to FIGS. 2 to 12.

The base layer BS may include a bending portion BP, a first flat portion PP-1, and a second flat portion PP-2. The bending portion BP may correspond to the bending area BA, the first flat portion PP-1 may correspond to the first flat area FA-1, and the second flat portion PP-2 may correspond to the second flat area FA-2. For convenience of illustration and description, the bending portion BP, the first flat portion PP-1, and the second flat portion PP-2 are shown as portions of the base layer BS in FIGS. 16 and 18A to 18D, but the bending portion BP, the first flat portion PP-1, and the second flat portion PP-2 may be substantially the same as those described above with reference to FIGS. 2 to 12.

The first coating portion CM1 may be disposed on the bending portion BP. The first coating portion CM1 may be disposed to overlap the bending area BA. In an embodiment, the first coating portion CM1 may have a uniform thickness or may have different thicknesses depending on areas thereof, as described above. In one embodiment, for example, the thickness of the first coating portion CM1 may increase from opposite ends to a center thereof. Accordingly, a thickness DC of the center portion of the first coating portion CM1 may be greater than thicknesses DS1 and DS2 of the opposite ends of the first coating portion CM1, and the thickness DC of the center portion may be the greatest in the first coating portion CM1, as described above with reference to FIGS. 2 to 12.

Figure 17:
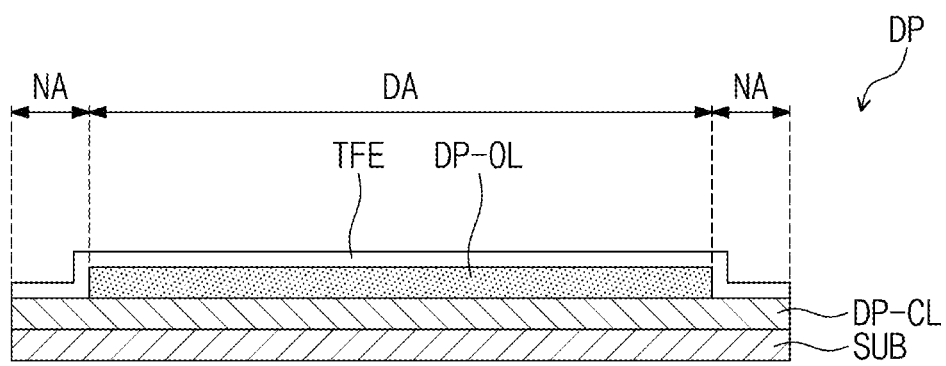
FIG. 17 is a cross-sectional view showing a display panel according to an embodiment of the disclosure.

FIG. 17 is a cross-sectional view showing the display panel DP shown in FIG. 15. Referring to FIG. 17, an embodiment of the display panel DP may include a substrate SUB, a circuit element layer DP-CL disposed on the substrate SUB, a display element layer DP-OL disposed on the circuit element layer DP-CL, and a thin film encapsulation layer TFE disposed on the display element layer DP-OL.

The substrate SUB may include a display area DA and a peripheral area NA around the display area DA. The substrate SUB may include a flexible plastic material such as polyimide ("PI"). The display element layer DP-OL may be disposed in the display area DA.

A plurality of pixels may be disposed or arranged in the circuit element layer DP-CL and the display element layer DP-OL. Each of the pixels may include a transistor disposed on the circuit element layer DP-CL and a light emitting element disposed on the display element layer DP-OL and connected to the transistor.

The thin film encapsulation layer TFE may be disposed on the circuit element layer DP-CL to cover the display element layer DP-OL. The thin film encapsulation layer TFE may include inorganic layers and an organic layer disposed between the inorganic layers. The inorganic layers may protect the pixels from moisture and oxygen. The organic layer may protect the pixels from a foreign substance such as dust particles.

FIGS. 18A to 18D are views showing a method of manufacturing the cover window according to an embodiment of the disclosure. An embodiment of the manufacturing method of the cover window may include inserting a base layer that includes a flat portion and a bending portion into a supporter that covers the flat portion and exposes an upper surface of the bending portion (S1), spraying a composition onto the exposed upper surface of the bending portion to form a coating portion on a portion overlapping the bending portion (S2), and separating the base layer on which the coating portion is formed from the supporter (S3).

Figure 18A:
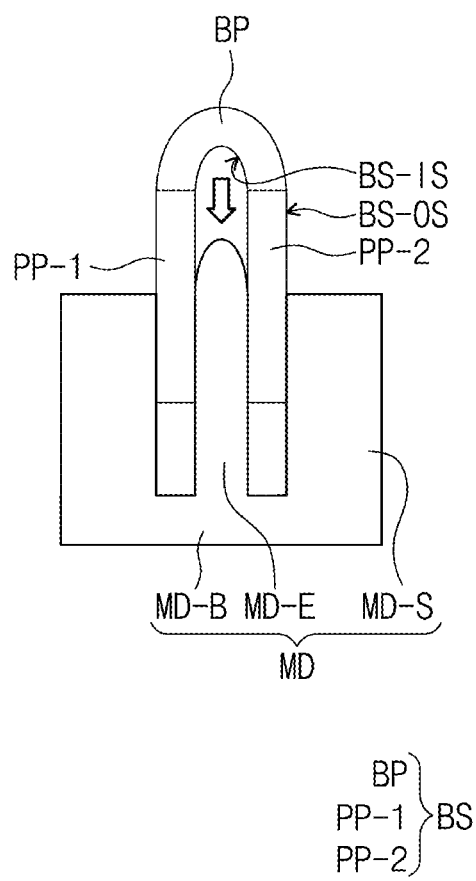
FIG. 18A is a cross-sectional view showing a method of manufacturing a cover window according to an embodiment of the disclosure.

FIG. 18A is a cross-sectional view showing the inserting of the base layer that includes the flat portion and the bending portion into the supporter that covers the flat portion and exposes the upper surface of the bending portion (S1). The base layer BS may include the bending portion BP, the first flat portion PP-1, and the second flat portion PP-2. The base layer BS inserted into the supporter may be substantially the same as the base layer BS described above with reference to FIGS. 2 and 3.

The supporter MD may include a base portion MD-B, a protruding portion MD-E, and an outer support portion MD-S. The protruding portion MD-E may be disposed on the base portion MD-B and may support the base layer BS. The protruding portion MD-E may have a shape corresponding to a shape of the inner side BS-IS of the base layer BS disposed on the protruding portion MD-E. Accordingly, the protruding portion MD-E may have a height greater than a height of the outer support portion MD-S due to the shape of the base layer BS.

The outer support portion MD-S may be disposed on the base portion MD-B and may be disposed at both ends of the base portion MD-B with respect to the protruding portion MD-E, but not being limited thereto or thereby. Alternatively, the outer support portion MD-B may be disposed to surround a peripheral portion of the base portion MD-B. The first flat portion PP-1 and the second flat portion PP-2, which are included in the base layer BS, may be respectively inserted into spaces between the outer support portion MD-S and the protruding portion MD-E. As the first flat portion PP-1 and the second flat portion PP-2 are inserted, an upper surface of each of the first flat portion PP-1 and the second flat portion PP-2 may be covered by the outer support portion MD-S. That is, as the base layer BS is inserted into the supporter MD, only the upper surface of the bending portion BP included in the base layer BS may be exposed.

FIG. 18A shows a structure in which the outer support portion MD-S and the base portion MD-B are provided in a single unitary shape, but not being limited thereto or thereby. Alternatively, the outer support portion MD-S may be provided as a portion separated from the base portion MD-B and may cover the upper surface of the first flat portion PP-1 and the second flat portion PP-2 after the base layer BS is disposed on and supported by the protruding portion MD-E.

Figure 18B:
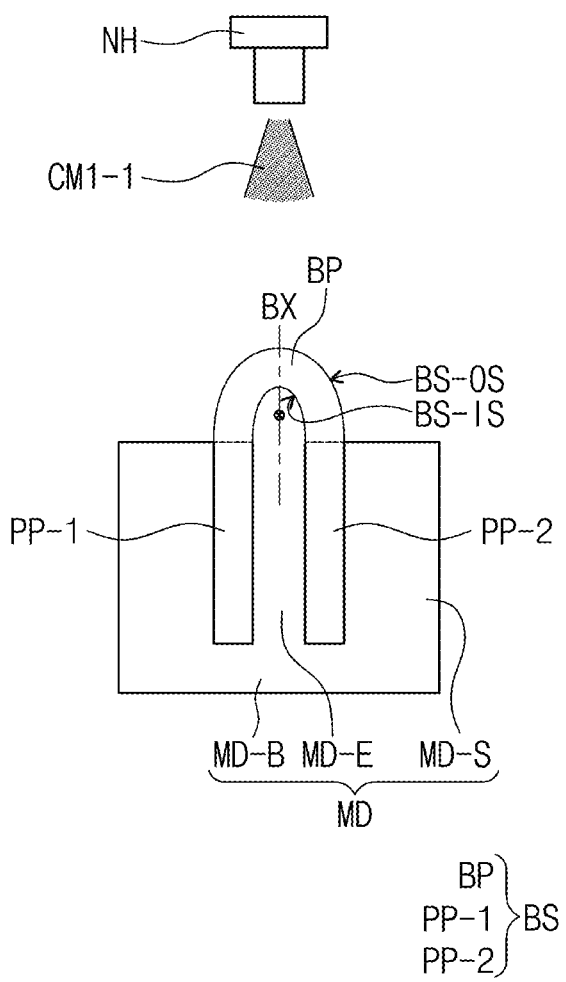
FIG. 18B is a cross-sectional view showing a method of manufacturing a cover window according to an embodiment of the disclosure.
Figure 18C:
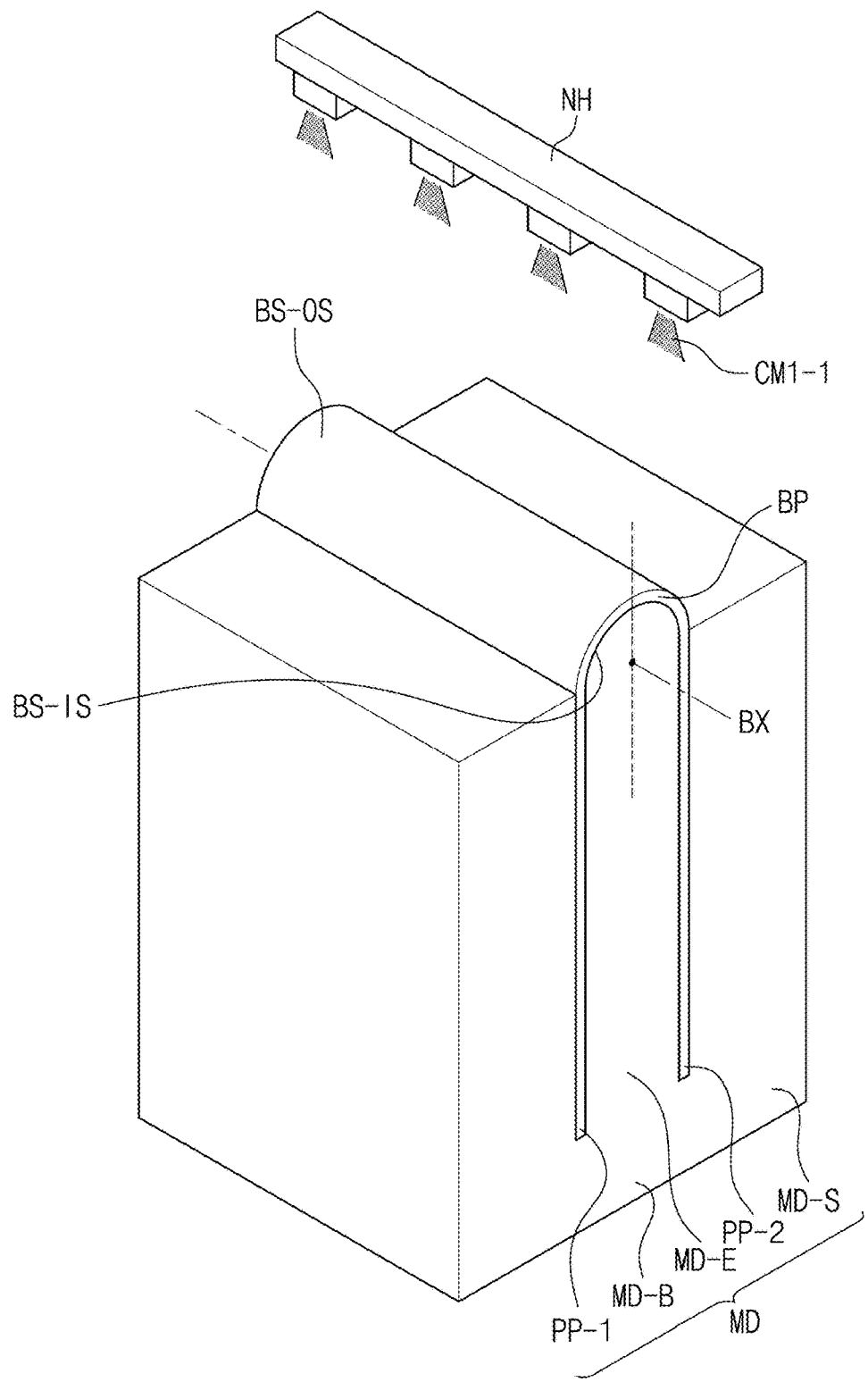
FIG. 18C is a perspective view showing a method of manufacturing a cover window according to an embodiment of the disclosure.

FIGS. 18B and 18C show the spraying of the composition onto the exposed upper surface of the bending portion and forming the coating portion to overlap the bending portion (S2). Particularly, FIG. 18B is a cross-sectional view thereof, and FIG. 18C is a perspective view thereof.

In an embodiment, as the base layer BS is inserted into the supporter MD, only the upper surface of the bending portion BP may be exposed. Since only the upper surface of the bending portion BP is exposed, the coating portion CM1 may be selectively formed in a desired area. A nozzle NH through which a composition CM1-1 of the coating portion CM1 is sprayed may be disposed above the bending portion BP. The thickness of the coating portion may be controlled by adjusting a viscosity, an amount, and a spray time of the composition sprayed through the nozzle NH.

The nozzle NH may be disposed to correspond to the center portion of the bending portion BP, which overlaps the bending axis BX, and thus, the coating portion CM1 in which the thickness thereof gradually decreases from a center to opposite ends thereof.

The composition CM1-1 may be a material used to form the coating portion CM1, and thus, may be included in the coating portion CM1. In one embodiment, for example, the composition CM1-1 may be an organic material, and the organic material may be, for example, polypropylene, polyethylene, or polyethylene terephthalate, but not being limited thereto or thereby.

Figure 18D:
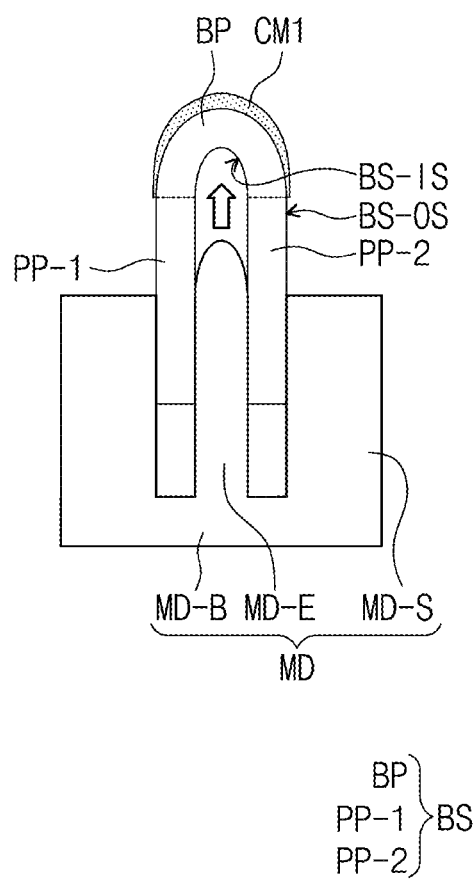
FIG. 18D is a cross-sectional view showing a method of manufacturing a cover window according to an embodiment of the disclosure.

FIG. 18D is a cross-sectional view showing the separating of the base layer on which the coating portion is formed from the supporter (S3). The shape of the coating portion may be changed by adjusting an arrangement of the nozzle, a property of the composition, and the spray time of the composition. In one embodiment, for example, after the processes shown in FIGS. 18B and 18C are performed, the coating portion CM1 may be formed to have the greatest thickness at the center portion thereof, and the thickness gradually decreases as a distance from the center portion increases.

According to an embodiment of the manufacturing method of the cover window, only a portion of the upper surface of the bent base layer included in the cover window may be selectively coated or may be selectively coated thick. According to such an embodiment of the manufacturing method of the cover window, only the upper surface of the bending portion of the base layer may be selectively coated, and the base layer may be smooth coated so that there is no step difference at a boundary between the base layer and the coating portion. According to such an embodiment of the manufacturing method of the cover window, as only the portion of the base layer is selectively coated, the cover window having the improved strength and aesthetic impression may be provided. In such an embodiment, as the coating portion is directly coated on the base layer, a process of bonding using an adhesive may be omitted.

In an embodiment of the invention, the coating portion included in the cover window may include portions having o different moduli from each other and less than the modulus of the base layer. Accordingly, in such an embodiment, the modulus of the area of the coating portion overlapping the bending portion may be less than the modulus of the area of the coating portion overlapping the flat portion. In an embodiment, the coating portion may have the relatively thick thickness in some areas thereof. In an embodiment, the thickness of the area of the coating portion overlapping the bending portion may be greater than the thickness of the area of the coating portion overlapping the flat portion. Accordingly, the strength of the cover window may be improved, and the aesthetic impression of the cover window may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A cover window comprising:
    a base layer comprising a bending portion bent about a bending axis extending in one direction, a first flat portion, and a second flat portion spaced apart from the first flat portion with the bending portion interposed therebetween in a direction crossing the one direction and facing each other; and
    a first coating portion disposed on the bending portion of the base layer and having a first modulus less than a modulus of the base layer, wherein a thickness of the first coating portion is less than a thickness of the base layer, and the thickness of the first coating portion is equal to or greater than about 50 μm and equal to or less than about 300 μm.

2. The cover window of claim 1, wherein a thickness of a center portion of the first coating portion, which overlaps the bending axis, is greater than a thickness of opposing end portions of the first coating portion, which are opposite to each other.

3. The cover window of claim 1, wherein the thickness of the first coating portion is equal to or greater than about 50 μm and equal to or less than about 150 μm.

4. The cover window of claim 1, wherein the first coating portion comprises at least one selected from polypropylene, polyethylene, and polyethylene terephthalate.

5. The cover window of claim 1, wherein the first coating portion is in contact with the bending portion.

6. The cover window of claim 1, further comprising:
a second coating portion disposed on the first flat portion and the second flat portion,
wherein the second coating portion has a second modulus equal to or greater than the first modulus and less than the modulus of the base layer.

7. The cover window of claim 6, wherein the second coating portion is disposed under the first coating portion and covers an entire surface of the base layer.

8. The cover window of claim 7, further comprising:
a third coating portion disposed between the first coating portion and the second coating portion to cover the second coating portion,
wherein the third coating portion has a modulus equal to the first modulus, and the second modulus is greater than the first modulus.

9. The cover window of claim 6, wherein the second coating portion comprises:
a first sub-coating portion disposed on the first flat portion; and
a second sub-coating portion disposed on the second flat portion,
wherein the first sub-coating portion and the second sub-coating portion are spaced apart from each other with the first coating portion interposed therebetween.

10. The cover window of claim 9, wherein the first coating portion has a thickness equal to a thickness of the second coating portion.

11. The cover window of claim 9, wherein a thickness of the first coating portion is greater than a thickness of the second coating portion.

12. The cover window of claim 1, wherein the base layer comprises a glass material.

13. The cover window of claim 1, wherein the thickness of the base layer is equal to or greater than about 0.1 mm and equal to or less than about 1.0 mm.

14. A display device comprising:
a display panel comprising a bending area bent about a bending axis extending in one direction, a first flat area, and a second flat area spaced apart from the first flat area with the bending area interposed therebetween in a direction crossing the one direction and facing each other;
a cover window disposed on the display panel; and
an adhesive layer disposed between the display panel and the cover window, and
the cover window comprising:
a base layer comprising a first flat portion corresponding to the first flat area, a bending portion corresponding to the bending area, and a second flat portion corresponding to the second flat area; and
a first coating portion disposed on the bending portion of the base layer and having a first modulus less than a modulus of the base layer,
wherein a thickness of the first coating portion is less than a thickness of the base layer, and the thickness of the first coating portion is equal to or greater than about 50 μm and equal to or less than about 300 μm.

15. The display device of claim 14, wherein the thickness of the first coating portion is equal to or greater than about 50 μm and equal to or less than about 150 μm.

16. The display device of claim 14, wherein a thickness of a center portion of the first coating portion, which overlaps the bending axis, is greater than a thickness of opposing end portions of the first coating portion, which are opposite to each other.

17. The display device of claim 14, further comprising:
a second coating portion disposed on the first flat portion and the second flat portion,
wherein the second coating portion has a second modulus equal to or greater than the first modulus and less than the modulus of the base layer.

* * * * *